United States Patent
Gupta et al.

(10) Patent No.: US 7,701,286 B2
(45) Date of Patent: Apr. 20, 2010

(54) MULTIBIT DIGITAL AMPLIFIER FOR RADIO-FREQUENCY TRANSMISSION

(75) Inventors: Deepnarayan Gupta, Hawthorne, NY (US); Alan Kadin, West Windsor, NJ (US)

(73) Assignee: Hypres, Inc., Elmsford, NY (US)

( * ) Notice: Subject to any disclaimer, the term of this patent is extended or adjusted under 35 U.S.C. 154(b) by 147 days.

(21) Appl. No.: 12/002,592

(22) Filed: Dec. 18, 2007

(65) Prior Publication Data

US 2008/0290938 A1    Nov. 27, 2008

Related U.S. Application Data

(60) Provisional application No. 60/931,128, filed on May 21, 2007.

(51) Int. Cl.
    *H03G 3/00* (2006.01)
(52) U.S. Cl. .................... 330/127; 330/295
(58) Field of Classification Search ............ 330/127, 330/295, 124 R, 84, 297
    See application file for complete search history.

(56) References Cited

U.S. PATENT DOCUMENTS 5,930,128 A * 7/1999 Dent .......................... 363/43
7,539,269 B2 * 5/2009 Vadde et al. ................ 375/297

* cited by examiner

*Primary Examiner*—Robert Pascal
*Assistant Examiner*—Hieu P Nguyen
(74) *Attorney, Agent, or Firm*—Henry I. Schanzer, Esq

(57) ABSTRACT

A broadband multibit digital radio-frequency (RF) signal is synthesized digitally. to convert the digital signal to a high-power analog signal for RF transmission. Each bit (or cluster of bits) of the digital signal is first separately amplified using a fast switching amplifier with a controlled dc power supply voltage. The DC voltages are weighted to match the significance of the bits, and controlled by a set of calibrated DC reference sources to maintain high precision. The amplified digital signals from the various bits are then combined and passed through an appropriate analog filter to generate the RF signal to be transmitted. Such a signal can exhibit broad bandwidth, high dynamic range, excellent linearity, and low noise. Preferred embodiments of this system can incorporate superconducting electronic elements. For ultimate precision, a set of primary or secondary DC voltage standards can be used to regulate the switching amplifier supply voltages.

18 Claims, 8 Drawing Sheets

Fig. 4.

Fig. 1. Prior Art Digital Transmitter

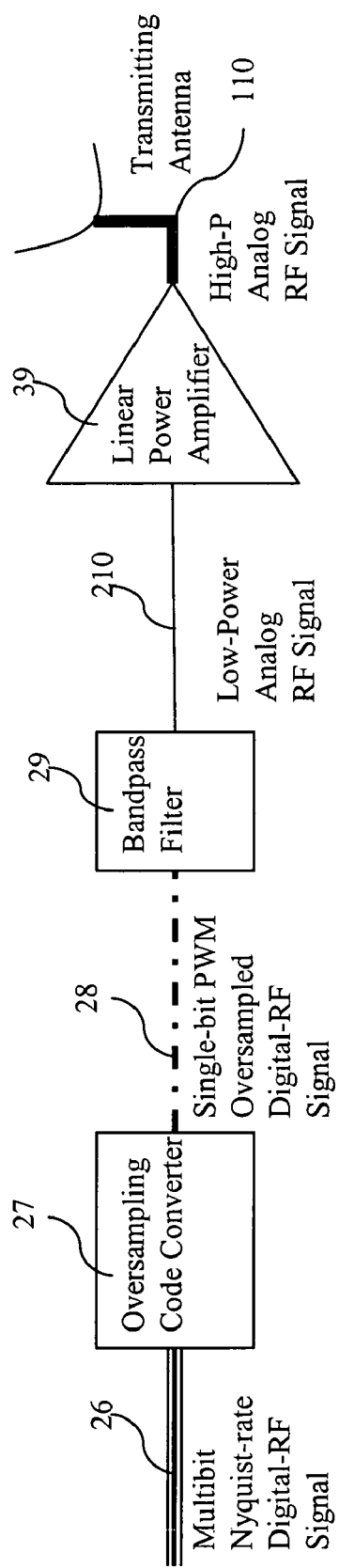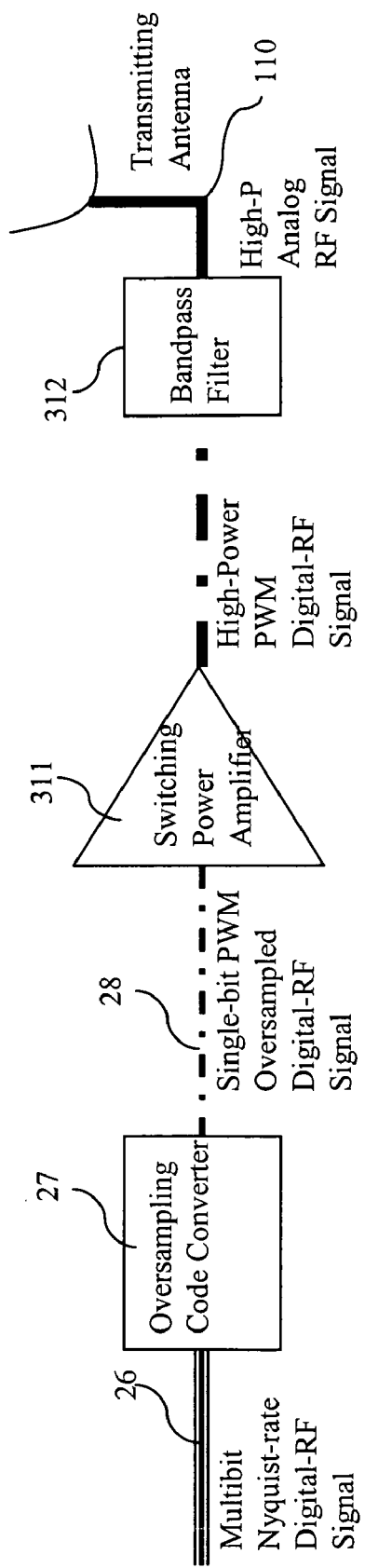
Fig 3A Prior Art
Fig. 3B Prior Art

MULTIBIT DIGITAL AMPLIFIER FOR RADIO-FREQUENCY TRANSMISSION

This application claims priority from a provisional application titled Multibit Digital Amplifier For Radio-Frequency Transmission bearing Ser. No. 60/931,128 filed May 21, 2007.

BACKGROUND

This invention relates to radio-frequency (RF) transmission and more particularly to digital RF transmission.

A conventional prior art digital transmitter system, as shown in FIG. 1, includes a digital baseband signal (11), typically a multibit narrowband signal at the Nyquist sampling frequency in the range of 1 MHz. This is then converted to an analog baseband signal 13 using a narrow band digital-to-analog converter (DAC), 12. The baseband analog signal 1.3 is then fed to an analog mixer 14 to which is fed the output 15 of an analog local oscillator (LO) 16. The output of mixer 14 is then fed to an analog bandpass filter 17 which is used to eliminate undesired mixer products. The resulting analog RF signal, 18, is amplified by a conventional linear amplifier 19 and fed to a transmission antenna 110 for broadcasting.

An alternative prior art system shown in FIG. 2 has been gaining attention in recent years. In this system the signal may be maintained in digital form until much closer to the antenna by employing a concept which is termed "Software Radio" or "Software-Defined Radio" (SDR). Here the digital baseband signal (11) is first upsampled using a fast digital interpolation filter 21 to produce an upsampled signals 22. The up-sampled signals 22 are then multiplied by means of a digital multiplier 23 which is supplied with sampling signals 24 generated by a digital Local Oscillator 25 (operating at a frequency of approximately 1 GHz) to generate a multi-bit digital-RF signal 26. Thus, a digital local oscillator and a digital up converter are used to generate a multibit digital RF signal, 26. This Nyquist-rate multi-bit signal 26 may be converted to an even faster oversampled single-bit digital signal with the same in-band dynamic range, using an "Oversampling Code Converter" (OCC), 27. The OCC 27 may be comprised of a digital delta-sigma modulator, or alternatively a "staggered thermometer code" circuit as described in U.S. Pat. No. 6,781,435. The oversampled bitstream 28 at the output of OCC 27, identified in FIG. 2 as a single bit pulse width modulated (PWM) oversampled digital RF signal, can then be passed through an analog bandpass filter 29 to create a broadband analog RF signal 210, which can then be amplified via a power amplifier such as linear amplifier 19 for transmission to a transmitting antenna such as 110.

While the architecture for a digital-RF transmitter shown in FIG. 2 has been discussed in the prior art, to Applicants' knowledge it has never actually been implemented for a broadband RF signal, because it requires an oversampling code converter (e.g., OCC 27) which has to operate faster than can be achieved by existing circuit technology. Thus, the digital-RF approach is difficult or impossible to achieve with conventional technology, given the very fast multi-GHz sampling and digital processing rates required.

Another problem with processing the multibit digital RF signals 26 (and/or the bit stream out of OCC 27) is that these signals, especially if generated using Josephson junction (JJ) based circuits, are of very low amplitude and need to be greatly amplified to increase their voltage/current (power) level before application to an antenna for transmission. One approach, shown in FIG. 3A, is to take the low power analog RF signal 210 from bandpass filter 29 (see FIG. 2) and feed it to a high-quality linear analog amplifier 39. But this mode of power amplification is power-inefficient if linearity is to be maintained, and can introduce noise into the signal.

An alternative approach, as shown in FIG. 3B, is to maintain the signal in a single-bit digital format. Here the output 28 of the OCC is applied to a single switching amplifier 311 whose output swings quickly between the voltage rails of the power supply, e.g., an amplifier which may be operated as a class S or class D amplifier. If the amplifier switching is fast enough, this will reproduce the input PWM stream with larger amplitude, with good power efficiency and without distortion. However, although the switching scheme of FIG. 3B is more efficient than the scheme of FIG. 3A, it requires circuits that need to switch faster than is available using existing amplifier technology. That is, there is no known single amplifier fast enough to perform this function, at the frequencies of interest.

Thus, although the concepts of FIGS. 3A and 3B have been discussed (see, for example, FIG. 8 in P. Asbeck et al., "Digital Signal Processing up to Microwave Frequencies", IEEE Trans. MTT vol 50, no 3 pp. 900-909, 2002), to Applicants' knowledge, they have never been implemented for a broadband RF signal, since the required switching speeds are greater than can be obtained using conventional technology.

Accordingly, a problem exists in processing the signals at the high frequencies (e.g., gigahertz range) of interest. This problem is resolved in circuits and systems embodying the invention.

SUMMARY OF THE INVENTION

The present invention is designed to achieve the performance advantages of a broadband, high-dynamic-range all-digital-RF transmitter, without requiring an unreasonably high rate of digital processing and switching. This is achieved through the increased use of bit-parallel processing through the entire digital amplification chain. A parallel array of amplifiers is used, each amplifier having a different operating voltage to reflecting the weighting of a given bit or bit cluster. The precision of the combined RF signal may be maintained by carefully controlling each operating voltage to match an appropriate stable reference standard. A preferred embodiment of the invention combines fast digital superconducting electronic elements with fast semiconductor switching amplifiers. For ultimate precision, a Josephson primary voltage standard may be used to control the operating voltages supplied to the amplifiers.

BRIEF DESCRIPTION OF THE DRAWINGS

In the accompanying drawings like reference characters denote like components and;

FIGS. 3A and 3B are block diagrams of prior art power amplifiers for digital RF transmission;

DETAILED DESCRIPTION OF INVENTION

Figure 1:
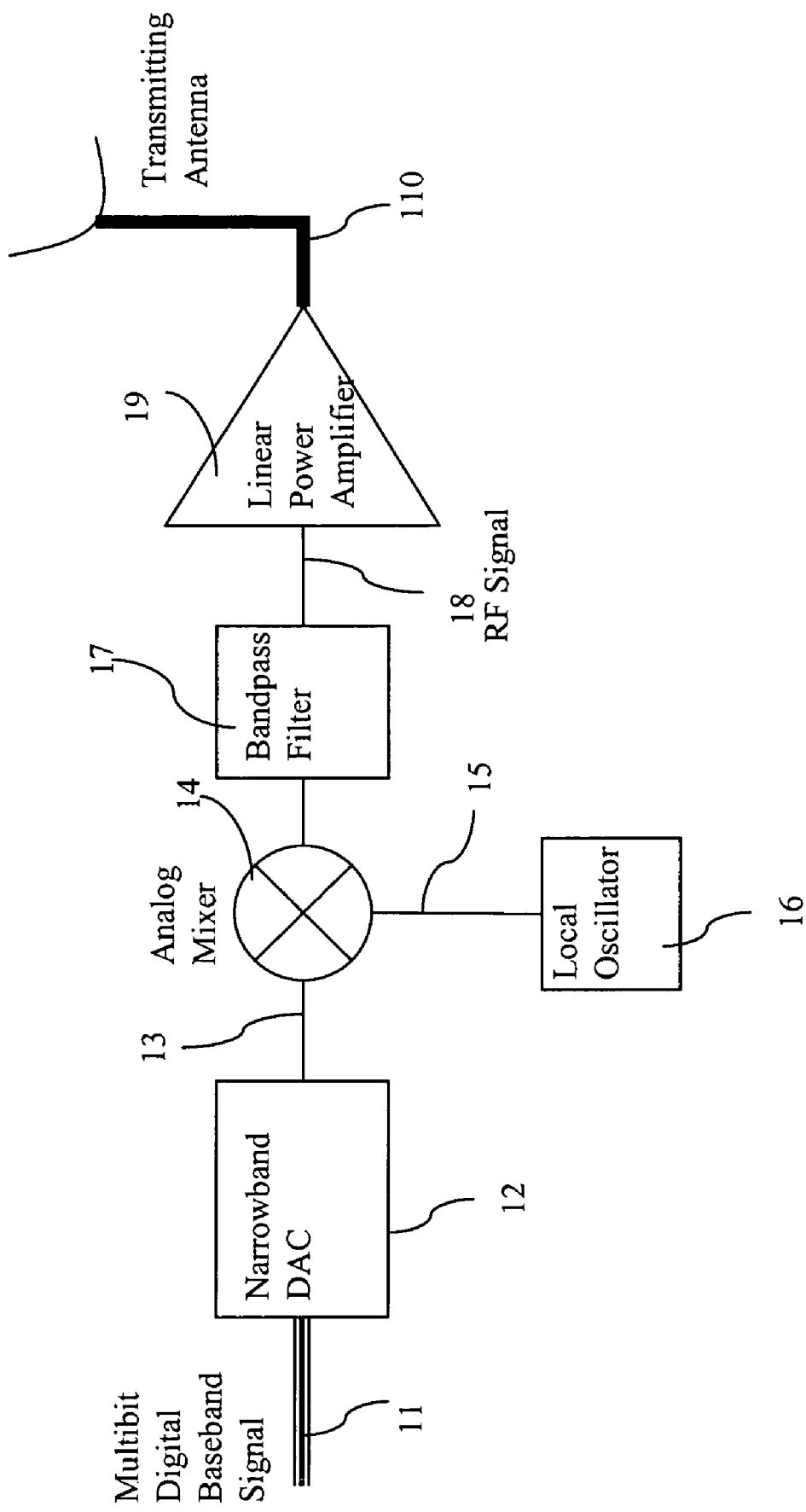
FIG. 1 is a block diagram of a prior art digital transmission system.
Figure 2:
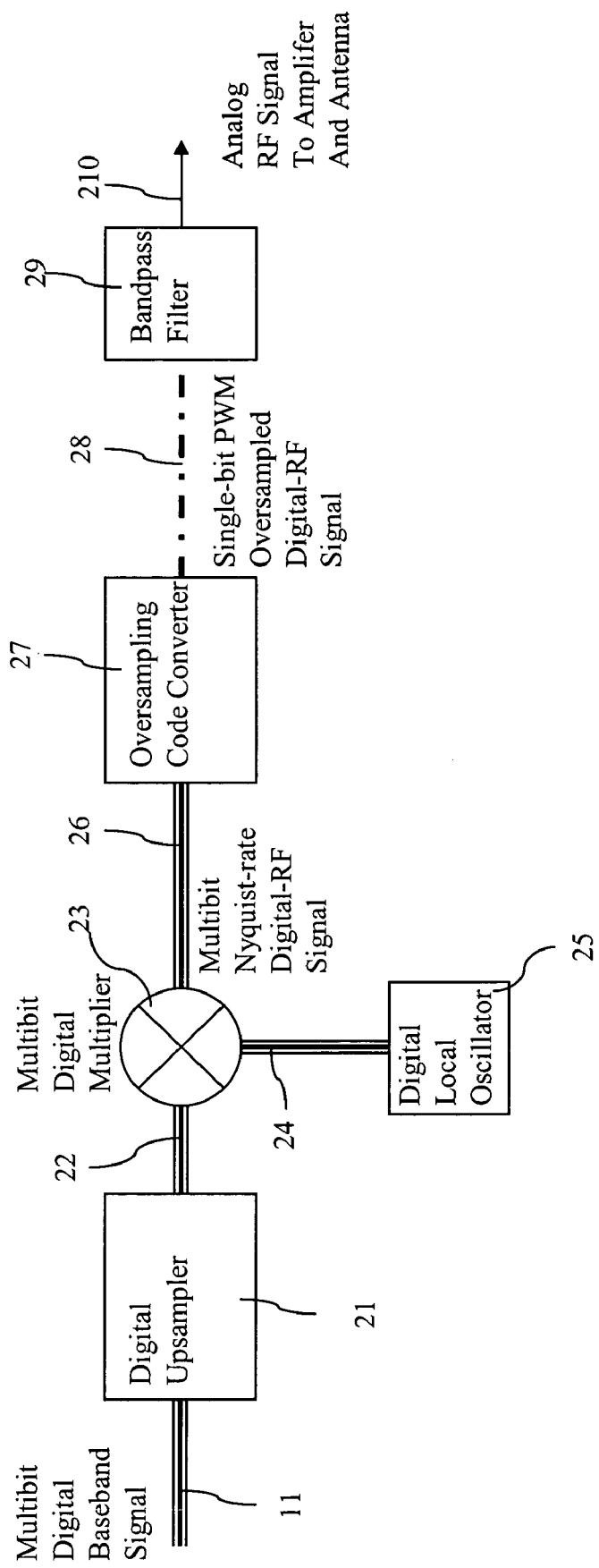
FIG. 2 is a block diagram of a prior art software-defined radio (SDR) transmission system.

As already noted, this invention relates to the processing of multibit (parallel) digital signals RF signals (e.g., 26) which may be generated, for example, as shown in FIG. 2, by digitally up sampling digital baseband signals to produce upsampled signals 22 which are then multiplied via a multibit digital multiplier (e.g., 23) to produce corresponding multibit Nyquist rate digital RF signals (e.g., 26).

A technology that has the required speed to accomplish the desired processing and transmission of signals is based on Josephson junctions (JJs), and referred to as "Rapid Single Flux Quantum" logic, or RSFQ. Complex RSFQ circuits have been demonstrated with clock speeds up to 40 GHz, and simple circuits with speeds up to 800 GHz. This is much faster than any other integrated-circuit electronic technology. However, the characteristic voltage of JJ circuits is extremely small, of the order of 200 microvolts for the current fabrication technology. Therefore, if JJs are to be used for a transmitter, a very large amplification factor is needed. This requires the use of semiconductor transistor power amplifiers, which are not quite as fast.

The invention may be explained by reference to FIG. 4 which shows a multi-bit digital-RF signal 26 synthesized at (or slightly above) the Nyquist frequency corresponding to the band of interest. In the embodiment shown in FIG. 4, there are N bits; starting from bit 1, which is defined as the least significant bit (LSB), extending to bit N, which is defined as the most significant bit (MSB). The number of bits may be any number deemed appropriate for the application and may vary over a wide range (e.g., from less than 8 to more than 30). Each bit, B(i), is applied to a corresponding switching amplifier 41(i).

Figure 8:
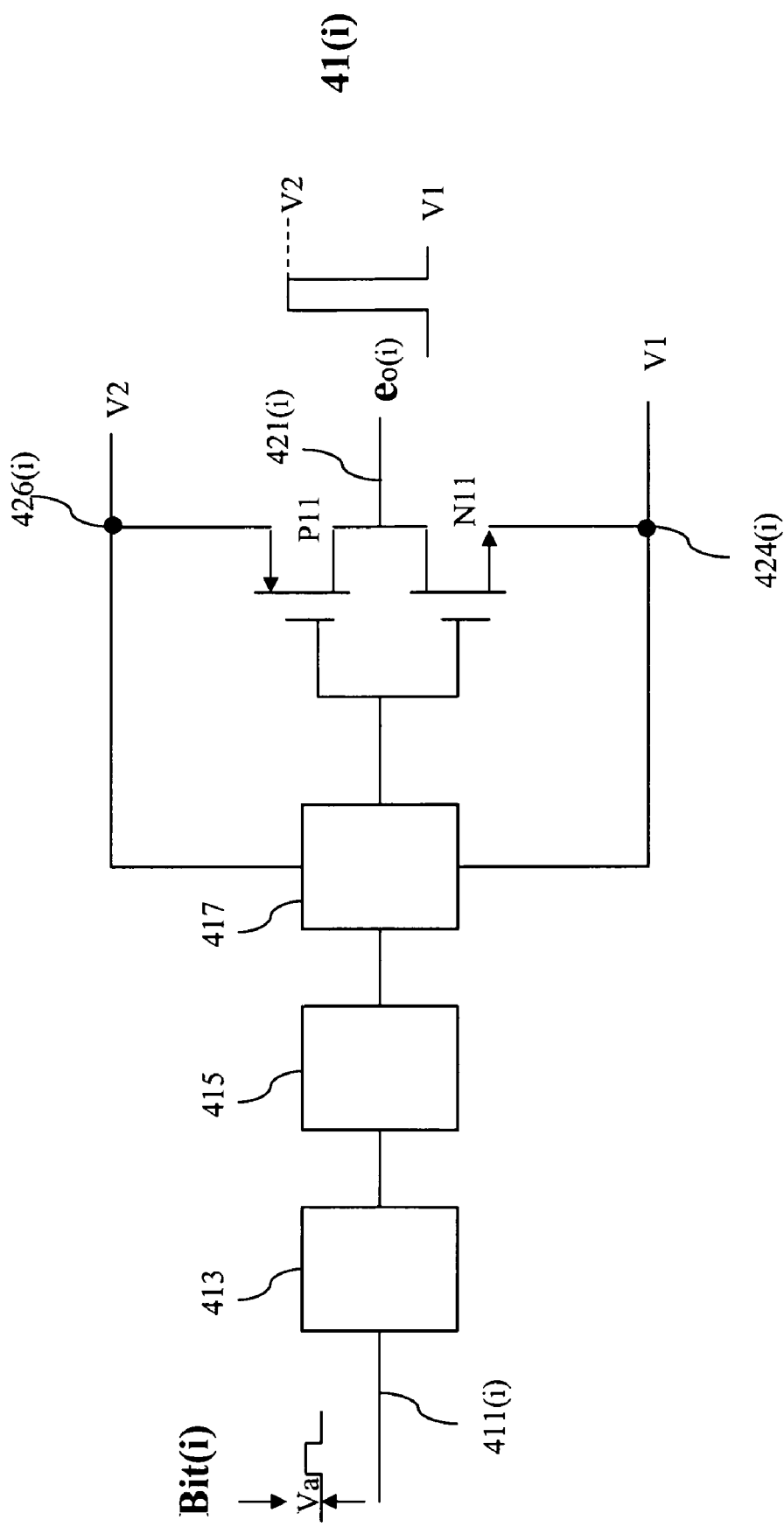
FIG. 8 is a simplified semi-block semi-schematic diagram of a switching amplifier suitable for use in practicing the invention.

As shown in FIG. 8, each one of the switching amplifiers 41(i) has a signal input, 411(i), a signal output, 421(i), and two power terminals, 424(i) and 426(i); the power terminals for the application therebetween of an operating voltage. Each switching amplifier is supplied with an operating (supply) voltage corresponding to the significance (order or weight) of the signal input bit applied to that amplifier. The amplifier to which the least significant bit (LSB) is applied has the smallest supply voltage (i.e., $V_{LSB}$) applied to it. For the binary system of FIG. 4, the supply voltage of each succeeding amplifier, corresponding to a more significant (higher) bit, has a supply voltage that is a factor of two (for a binary system) larger than the previous most significant bit, etc. For the circuit of FIG. 4, it is assumed that each succeeding bit increases by a factor of two (2) and that each higher bit is applied to a corresponding amplifier. The amplitude of the operating voltages applied to the various amplifiers 41(i) may then be expressed as:

$$V(i)=2^{(i-1)}V_{LSB};$$

where (i) is the order of the bit and (i) varies form 1 to N.

For example, a 12-bit digital RF signal with a 1 GHz bandwidth could have a 2 GS/s output sampling rate, and a parallel array of 12 switching amplifiers, with supply voltages that might range in factors of two from 8 Volts down to 3.9 milliVolts (1/256 V). Thus, in circuits embodying the invention, the order of the bits is converted to a specific voltage. This provides a bit to voltage amplitude conversion. For example, assuming bit 1 (B1) to be the LSB, a value of $V_{LSB}$ is assigned to the bit, a voltage of $2V_{LSB}$ is assigned to bit 2, and so on for the next bits.

Figure 4:
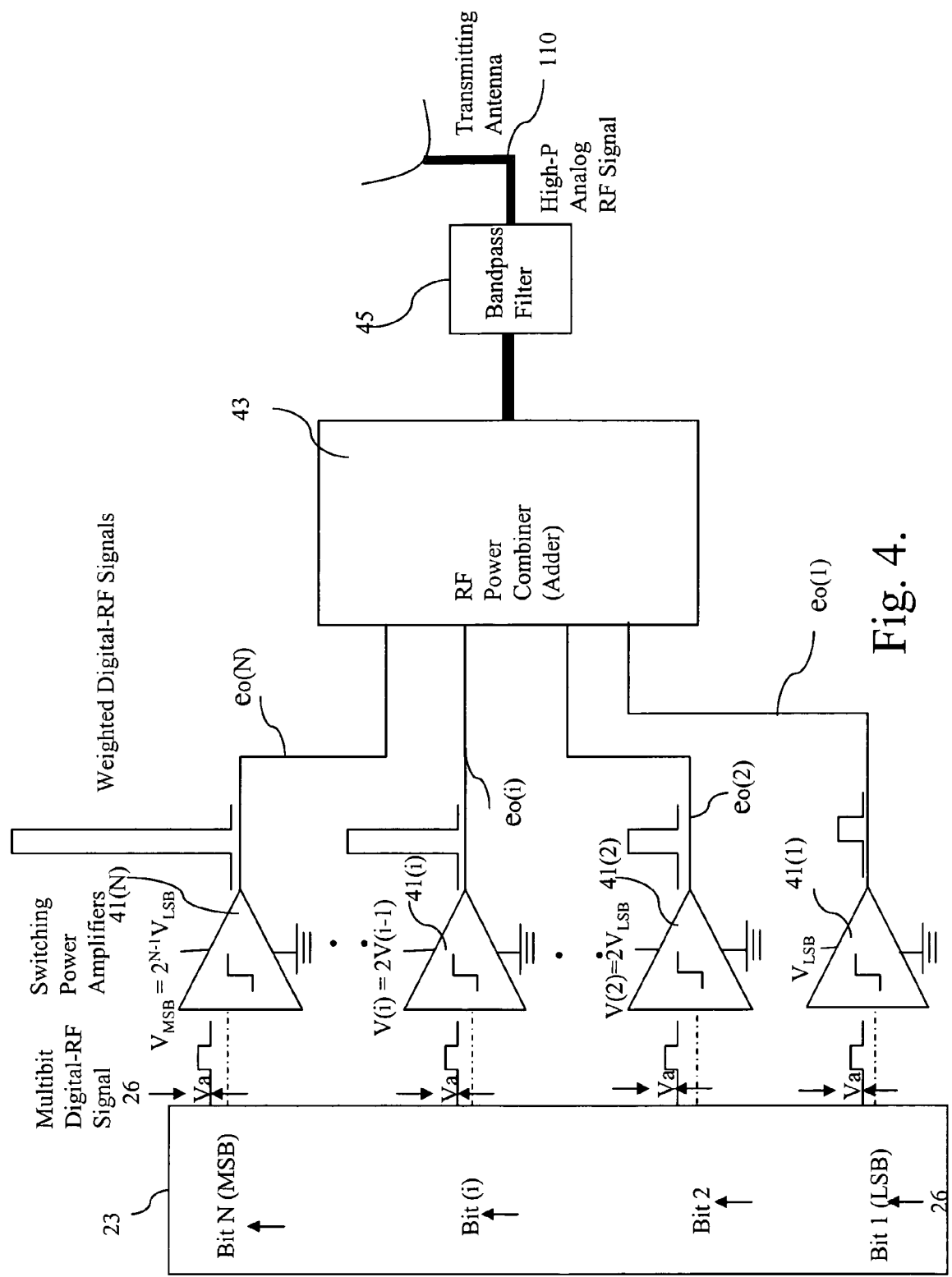
FIG. 4 is a block diagram of a parallel digital amplifier for digital RF transmission in accordance with the invention.

FIG. 4 represents a new parallel digital amplifier for a digital-RF transmitter. The N bits of (1 to N) of a Nyquist-rate multibit digital-RF signal (26 in FIGS. 2 and 4) are amplified in parallel, with an array of switching amplifiers [41(1) to 41(N)]. This replaces and is used instead of the Oversampling Code Converter (OCC) of the prior art, as shown in FIG. 3B. In the circuit of FIG. 4, the operating voltages [(K)$V_{LSB}$] for the switching amplifiers [41(1) to 41(N)] increase by a factor of two from one bit to the next higher order bit, with a maximum for the most significant bit (MSB). For ease of illustration, in FIG. 4, each amplifier is shown biased between ground and (K)$V_{LSB}$; where K varies between 1 and $2^{N-1}$. However, it should be appreciated that the operating voltage may be disposed about ground. That is, each amplifier 41(i) is connected between two voltage rails [e.g., 424(i) and 426(i)] and positive (+V) and negative (−V) voltages may be applied to the rails to generate the desired operating voltage between the two rails to be applied to the corresponding amplifier.

Referring back to FIG. 8, note that a switching amplifier 41(i) may include stages (e.g., 413, 415, 417) of pre-amplification and level shifting to boost the bit input signal (which may be on the order of 0.2 millivolts) to a level (of several volts) which will enable the output of complementary field effect transistors (FETs) P11, N11 to clamp the output $e_o(i)$ to the lower rail, 424(i), or the upper rail, 426(i), depending on the value of the bit input signal. In operation, either: (a) P11 will be turned on and N11 will be turned off clamping the output of the amplifier to the positive rail; or (b) P11 will be turned off and N11 will be turned on clamping the output of the amplifier to the negative rail. As is known in the art, this type of witching is highly power efficient. Note that in systems embodying the invention the electronic circuitry leading up to the output stage of the switching amplifier may be superconducting devices or a mixture of superconducting and semiconductor devices.

As noted above, the switching amplifiers, 41(i), are preferably (but not necessarily) comprised of an output stage with two switches in series between the two voltage rails, with an output terminal between the two switches, such that only one of the two switches is closed at any time. The switches may be comprised of transistors such as FETs. Therefore the output voltage switches between the two voltage rails. The switches are controlled by a switching controller (e.g., circuits 413, 415, 417) which rapidly shifts between the two configurations depending on the input voltage level. If the input consists of digital pulses, the output consists equally of digital pulses, but of larger amplitude. Such switching amplifiers are known for their high power efficiency, since in principle virtually all of the power is delivered to the load.

It should be appreciated that the signal transmission system and the associated circuitry is designed for synchronous operation and production of the signals at the outputs of the amplifiers; i.e., they are intended to occur at essentially the same time. In order to achieve the highest precision of the multi-bit digital amplifier, the amplified voltage outputs representing the various bits must be properly synchronized relative to each other. This may be accomplished by appropriate timing of the delays in the preamplifiers 413, 415, 417 and/or the use of delay networks to ensure that all bit signals, whether requiring more or less amplification, have essentially equal delays. Alternatively, clocking signals may be used to keep the bit signals aligned. Fore example, synchronization may be achieved by using a set of latches and a common clock signal, derived from the clock signal of the digital inputs. In some cases, amplifiers for the various bits may switch with different speeds, due to the different output slew rates of the different amplifiers. In such a situation, appropriate delays may be inserted in the lines for the various bits, either before or after the amplifiers, to ensure optimum phase synchronization of the various parallel components.

FIG. 4 illustrates that the signal input to each switching amplifier is of (the same) very low amplitude (e.g., Va). The gain of each switching amplifier is controlled (see FIG. 8) to ensure that the input signal causes the output of each switching amplifier to switch between the positive rail (e.g., $V_{LSB}$, $2V_{LSB}$, $4V_{LSB}$, etc. . . . ) and the negative rail (e.g., shown as ground in FIG. 4, but which could have another voltage applied). Note that, as shown in FIG. 4, the amplitude of the output of the Nth switching amplifier would correspond to the value of the operating voltage applied to the Nth switch amplifier 41(N). The outputs of the switching amplifiers, corresponding their respective input bits, are combined in RF combiner circuit 43 which is designed to suitably combine the outputs of the switching amplifiers. That is, the amplified digital-RF signals from the various bits present at the outputs of the amplifiers are combined via an RF power combiner 43, and then passed through an analog bandpass filter 45 to generate the RF signal to be broadcast.

Figure 6:
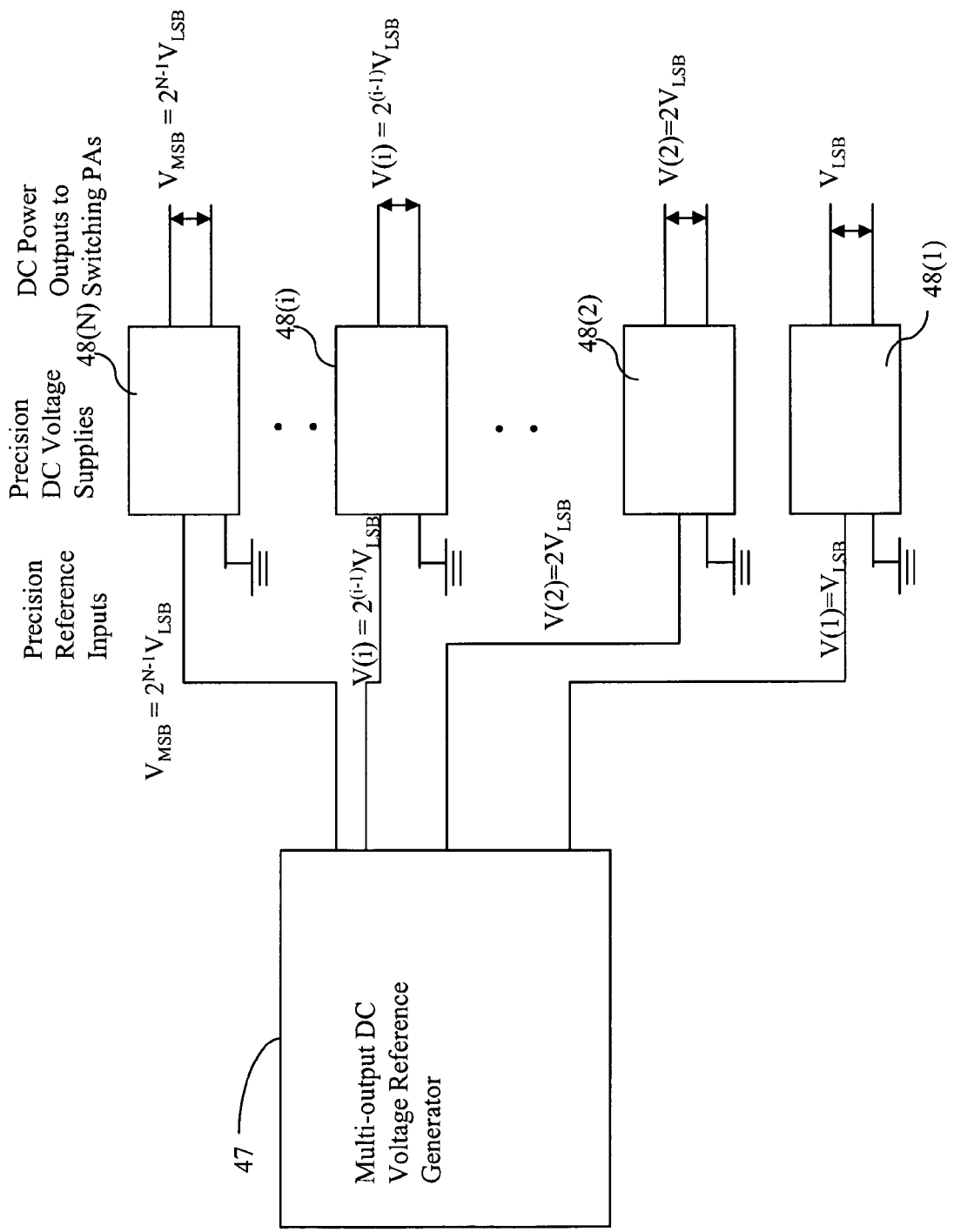
FIG. 6 is a block diagram of a voltage reference generator for generating precision operating voltages and distributing the operating voltages to amplifiers in accordance with the invention.

FIG. 6 illustrates a system for generating operating voltages suitable for distribution to the switching amplifiers used to practice the invention. A multi-output DC voltage reference generator (VRG) 47 may be used to generate a multiplicity of different operating voltages, V (i), as (i) varies from 1 to N. These voltages may be distributed via corresponding individual and separate voltage supplies 48(i) to the switching amplifiers. Thus, FIG. 6 shows a Voltage Reference Generator (VRG) 47 which can generate N different voltage levels [where V1 equals to $V_{LSB}$ up to V(N) equal to $2^{(N-1)}V_{LSB}$] to provide the operating voltages to the N different switching amplifiers. This corresponds to the operating voltages for the N bits shown in FIG. 4 where the different and subsequent operating voltage levels are set in ratios of 2 (or powers thereof). The VRG 47 may be any power supply which can provide precise, stable voltage values for the N reference levels from the milliVolt to the Volt level. (The VRG need not supply significant currents, but can be used to provide stabilization of the amplifier voltages against noise and drift). It is particularly important that the voltage for the MSBs be stable and precise when N is large. For example, for a 12-bit amplifier, supply fluctuations of the MSB amplifier of 1 part in 4000 are larger than the entire output of the LSB amplifier.

The VRG 47 may be a Josephson voltage standard (JVS) which can be used to generate the operating voltages supplied to the amplifiers. Such a standard may consist of more than 20,000 Josephson junctions in series, in which a precision microwave frequency of 77 GHz is converted to a series of DC voltages with precision and stability that is much better than 1 part per million, and virtually defines the standard Volt. It can also generate discrete voltage levels with up to 16 bits of resolution. By way of example, a JVS may be used as the VRG in either of two ways. In one application, the JVS is sequentially programmed to cycle through each of the N voltage levels, with a synchronous switch directing the appropriate output to a sample-and-hold circuit [e.g., 48(1) to 48(N)] and then to the reference input of each amplifier supply. In another application, a special JVS chip may be fabricated with multiple voltage taps along the series array that permit N parallel outputs with binary-scaled reference voltages. Because of the fundamental Josephson frequency-voltage relation V=hf/2e, where h is Planck's constant and e is the charge on the electron, a JJ can convert a frequency of 100 GHz to a voltage of 207 microvolts, still too small to be very useful.

A practical approach has been to boost the voltage by using a long series array of JJs, at the expense of speed. In fact, the volt is now defined internationally using an integrated circuit composed of approximately 20,000 JJs in series, to select dc voltages up to 10 V, to a precision of parts per billion. This is the Josephson Primary Voltage Standard (reviewed in "Applications of the Josephson effect to metrology", by S. Benz and C. Hamilton, Proceedings of the IEEE, 2004), which was developed by the US National Institute for Standards and Technology (NIST), and is now fabricated and marketed commercially by Hypres.

Alternatively, where extremely high precision voltages are not needed, conventional voltage references (with appropriate taps) may be used to provide the needed operating voltages.

The circuit of FIG. 4 may be compared to the previously discussed approach of FIGS. 3A and 3B, where the multibit signal is converted at low power to a heavily-oversampled single bit stream, which is then amplified. Such a prior art code converter requires up-sampling by a large factor, which would be $2^n$ for an n-bit signal and a first-order sigma-delta modulator (or an equivalent first-order code converter). For the 12-bit, 1 GHz example above, this would require sampling at 8192 GS/s, which is clearly impractical for any technology.

Figure 5:
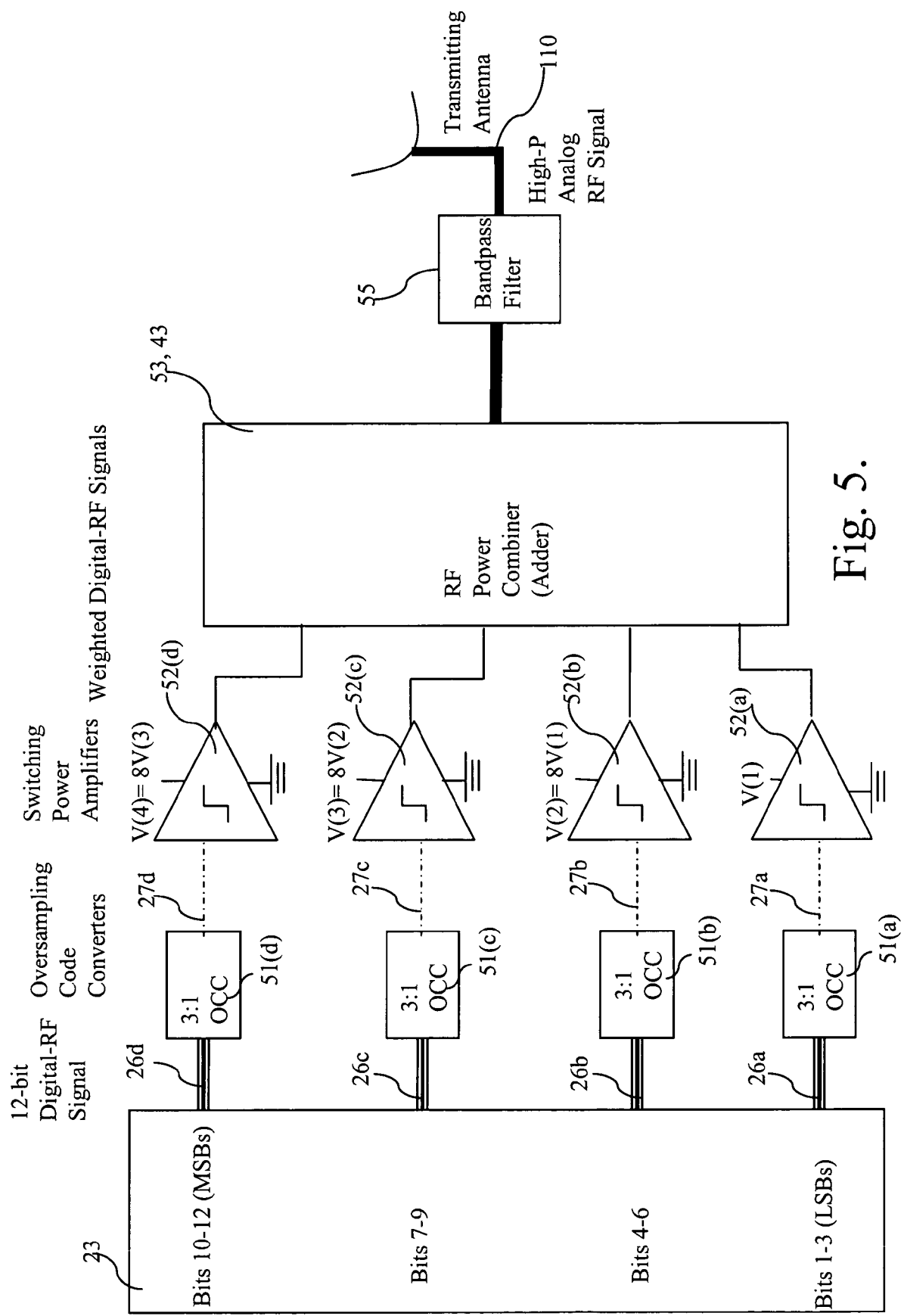
FIG. 5 is a block diagram of a parallel-serial digital amplifier for digital RF transmission in accordance with the invention.

FIG. 5 shows an alternative embodiment to the full parallel processing of the bits shown in FIG. 4. In FIG. 5 a compromise is made between maximum parallelism and the oversampled serial approach. In FIG. 5, each cluster of 3 bits (26a, 26b, 26c, 26d) is converted to a corresponding oversampled single bit stream (27a, 27b, 27c, 27d) with a sampling rate that is increased by a factor of $2^3=8$. (This conversion may be carried out using a delta-sigma modulator, or a digital encoder such as that shown in U.S. Pat. No. 6,781,435 to Gupta and Kadin.) For the 12-bit, 1 GHz example, there would now be 4 parallel output switching amplifiers (52(i), switching up to 16 GS/s, with supply voltages that might range (in factors of 8) from 8 Volts down to (1/64) Volts. Referring to FIG. 5, a 12-bit digital-RF signal is shown, for example, grouped into 4 clusters of 3 bits each. Evidently, other groupings (clusters) are permissible, as well as the number of bits per grouping/ clusters. An oversampling code converter [51(a)-51(d)] converts each 3-bit cluster to an oversampled single bitstream (here at 8× the sampling rate). Each cluster's bitstream is amplified with a switching amplifier (52i) having an operating voltage that increases by a factor of $2^3=8$ from one cluster to the next. This requires that switching amplifiers operate 8× faster than for the fully parallel approach of FIG. 4, with a reduction of hardware by about a factor of 3. The circuit/ system of FIG. 5 demonstrates that a system designer can trade off between speed and hardware for a given application.

In FIGS. 4 and 5 the operating voltages applied to the switching amplifiers varies between ground and a positive value. But, as already noted the operating voltage could vary between some (+V) and (−V) or even between ground and some negative value.

The optimum design of a transmission system depends on the balance between the speed of the available technologies and the acceptable level of hardware duplication. For any of the designs of the current invention, the linearity and dynamic range of the fully digital approach is to be maintained.

Superconducting RSFQ circuits are particularly fast, with 2-4 ps pulses and digital clock speeds of 20-40 GHz standard. The most advanced semiconductor power amplifiers, such as those composed of GaN high-electron-mobility transistors (HEMTs), have characteristic frequencies up to 90 GHz, corresponding to digital frequencies up to ~10 GHz. So, combining these two technologies should yield a practical approach to a broadband all-digital transmission system.

Note that in the approach of this invention, there is not a separate digital-to-analog converter (DAC) followed by amplification; the two functions are closely integrated together. The signal is maintained in digital format through the amplification chain, although the different gain factors for the various parallel bits permits simple addition to create a combined signal that may be close to the desired analog signal. The signal is not fully analog until it passes through the analog bandpass filters (45 in FIG. 4, 55 in FIG. 5) in front of the antenna (see FIGS. 4 and 5).

A broadband multi-carrier signal can incorporate many narrowband signals with sharply differing power levels. A digital transmitter system of the current invention must have sufficient dynamic range to include the weakest signals while avoiding saturation or distortion from the largest signals. In a fully digital system, nonlinear distortion (such as intermodulation) is avoided. However, it is also critical that the contributions from the parallel bit amplifiers all be properly matched in gain. For fast switching amplifiers, this reduces to controlling the dc supply voltages. This can be achieved by locking the supply voltage to an appropriate precision reference standard. The best standard, of course, is the Josephson voltage standard that virtually defines the volt, with parts per billion stability and 16 bits of dynamic range. This requires a cryogenic system, but that may already be available for the RSFQ digital synthesizer.

In summary, the present invention provides a practical way to achieve an all-digital RF transmitter for GHz-bandwidth systems, which can provide a large dynamic range and low noise.

Figure 7:
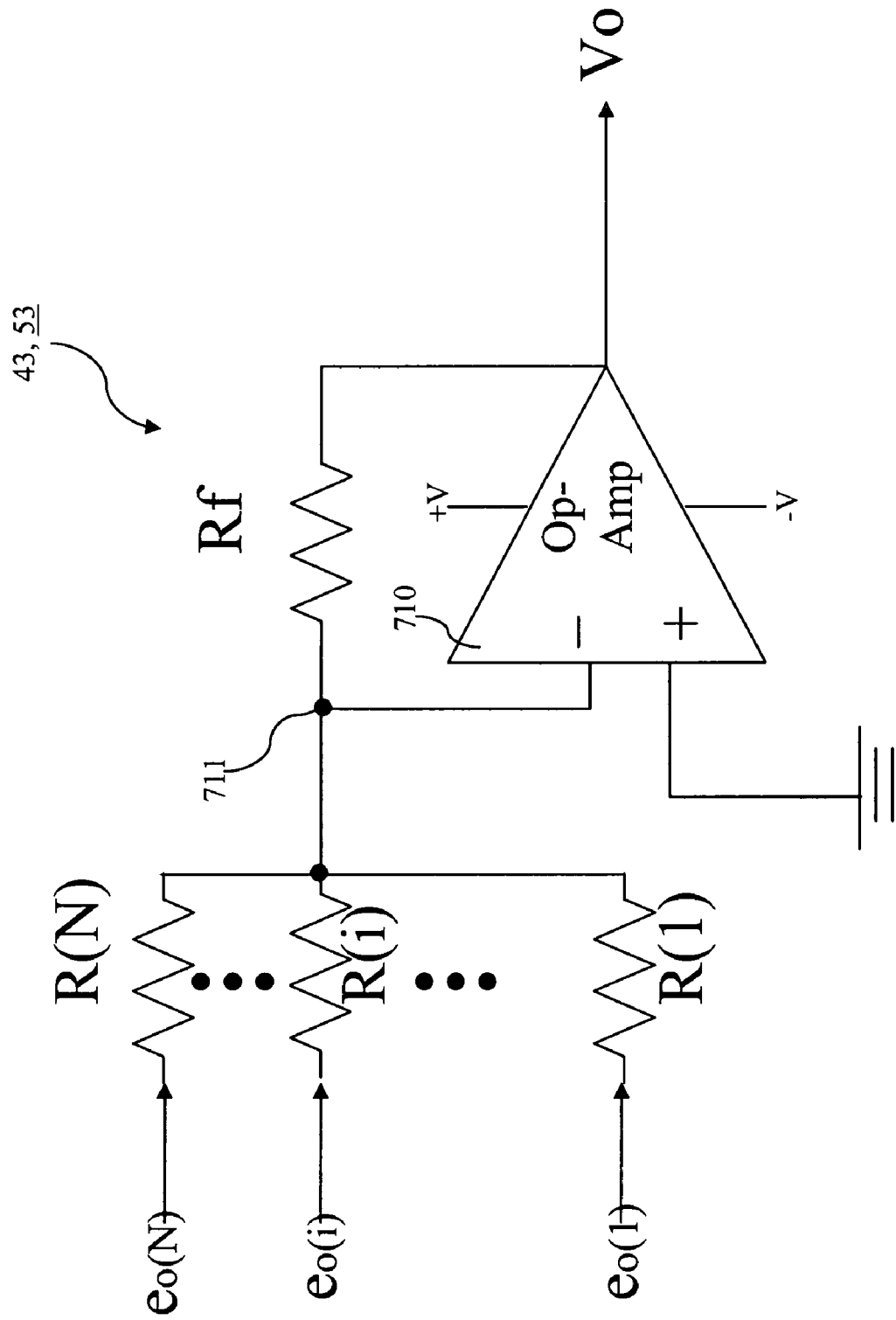
FIG. 7 is a block diagram of a combination circuit suitable for use in practicing the invention.

In FIGS. 4 and 5, there is shown a broadband RF power combiner (43 in FIG. 4, 53 in FIG. 5) which can suitably combine the outputs of the switching amplifiers. The outputs of the amplifiers [41($i$) and 52($i$)] include signal components which extend over the entire frequency range from DC to multiple GHz. This requires a very fast combiner circuit. FIG. 7 illustrates a combiner circuit (43 or 53) using a standard operational amplifier (op-amp) adder circuit. In FIG. 7, each output [$e_o(i)$] from a switching amplifier is connected to and terminated with a corresponding resistor (R1, R2, . . . ) connected to the inverting input 711 of an op-amp 710. Each resistor R(i) should ideally be matched to the transmission line impedance (typically of order 50 ohms) to prevent signal reflections. If the feedback resistor (Rf) is also 50 ohms, the signal gain would be unity, and the output voltage Vo=−(V1+V2+ . . . Vn). The signal inversion would not typically be a problem. If it is, a non-inverting op-amp adder may be used instead. For precision operation of this combiner circuit, the input resistors are preferably precisely matched to each other.

It may be difficult to find an op-amp with sufficient bandwidth for this operation. However, it may not be necessary to maintain the full bandwidth, particularly if the desired analog RF output lies within a specific RF band. Then DC and other out-of-band components would need to be filtered out before the antenna, and some of this filtering could be obtained in (or before) the combiner circuit. Several types of known resonant, relatively narrow-band, passive RF combiners, which are available commercially, could provide acceptable alternatives to the op-amp circuit of FIG. 7.

A more generalized type of switching amplifier, than the one shown and discussed above, which could be used to practice the invention, is one in which the output is tuned to resonate in a narrow bandwidth, usually by coupling to a passive resonator. A Class E amplifier is of this type. In this case, the output consists not of simple digital pulses, but rather of sinewaves that can be turned on and off. While the present invention focuses on a broadband transmitter using a set of classic digital switching amplifiers, the same system architecture could also be applied to a narrowband transmitter with a multi-bit digital input, here using resonant power amplifiers to maximize in-band power efficiency.

What is claimed is:

1. A multibit digital amplifier circuit comprising:
an N bit digital radio frequency (RF) signal present on N different lines, one bit per line; where the N bits have an order ranging from the least significant bit (LSB) to the most significant bit (MSB); where N is an integer greater than 1;
N amplifiers, one amplifier per bit, each amplifier having a signal input, a signal output and at least two power terminals for the application therebetween of an operating voltage for the amplifier;
means for applying each bit to the signal input of its corresponding amplifier; and
means for applying a different operating voltage to each amplifier; the applied voltage corresponding to the order of the input bit applied to the amplifier for converting its input bit to a voltage indicative of the order of the input bit.

2. A multibit digital amplifier circuit as claimed in claim 1, further including means for combining the outputs of the amplifiers for producing a voltage indicative of the value of the N bit digital RF signal.

3. A multibit digital amplifier circuit as claimed in claim 2, wherein at least those amplifiers to which the higher order bits are applied are switching amplifiers and each switching amplifier has sufficient gain to cause the voltage at its signal output to be clamped to the voltage at either one of the two power terminals, depending on the value of the input bit.

4. A multibit digital amplifier circuit as claimed in claim 3, wherein the means for applying an operating voltage to the amplifiers includes means for applying an operating voltage of $V_{LSB}$ across the power terminals of the amplifier processing the least significant bit defined as Bit (1) and an operating voltage of V(i) equal to $(2^{i-1})(V_{LSB})$ where "i" corresponds to the order of the bits and varies between 1 and N to each succeeding switching amplifier.

5. A multibit digital amplifier circuit as claimed in claim 3, wherein the means for applying an operating voltage to the amplifiers includes means for generating N different precision voltages for application to the N amplifiers; the N different voltages being equal to $(2^{i-1})(V_{LSB})$ where "i" corresponds to the order of the bits and varies between 1 and N; and means for applying the N different voltages to the N different amplifiers.

6. A multibit digital amplifier circuit as claimed in claim 3, wherein said means for combining the outputs of the amplifiers for producing a voltage indicative of the value of the N bit digital RF signal includes a combiner circuit for receiving and adding the voltage signals produced at the signal outputs of the amplifiers.

7. A multibit digital amplifier circuit as claimed in claim 6, wherein the combiner circuit has an output which is coupled to a bandpass filter for producing an analog RF signal for application to a transmitting antenna.

8. A multibit digital amplifier circuit as claimed in claim 6, wherein said N bit digital RF signal is generated and processed by superconducting circuits.

9. A multibit digital amplifier circuit as claimed in claim 1, wherein said means for applying an operating voltage to each amplifier corresponding to the order of the input bit applied to the amplifier includes a voltage reference generator adapted to generate N different voltages.

10. A multibit digital amplifier circuit as claimed in claim 9, wherein said voltage reference generator is a Josephson voltage standard.

11. A multibit digital amplifier circuit as claimed in claim 3 wherein said means for applying an operating voltage includes means for applying an operating voltage of $V_{LSB}$ to the power terminal of the switching amplifier corresponding to the least significant bit (LSB) defined as Bit (1) and an operating voltage of V(i) equal to $(2^{i-1})(V_{LSB})$; where "i" varies between 1 and N−1, to each succeeding switching amplifier.

12. A multibit digital amplifier circuit comprising:

an N bit digital radio frequency (RF) signal present on N different lines, one bit per line; where the N bits have an order ranging from the least significant bit (LSB) to the most significant bit (MSB); where N is an integer greater than 1; oversampling code converting means responsive to the N bit digital signal for converting the N bit signal into selected X groups of ordered bits present on X different lines; each one of the X lines carrying a signal corresponding to the bits of its group; where N and X are integers greater than one, and X is less than N; X switching amplifiers, one switching amplifier per group, each amplifier having a signal input, a signal output and two power terminals for the application therebetween of an operating voltage;

means for coupling each one of the X lines to the signal input of its corresponding switching amplifier; and means for applying an operating voltage across the power terminals of each switching amplifier corresponding to the order of the group of bits applied to the signal input of the amplifier for converting the input signal to the amplifier into a voltage indicative of the value of the bit input signal.

13. A multibit digital amplifier circuit as claimed in claim 12 further including means for combining the outputs of the switching amplifiers for producing a voltage indicative of the value of the N bit digital RF signal.

14. A multibit digital amplifier circuit as claimed in claim 13, wherein said oversampling code converting means responsive to the N bit digital signal includes means for converting the N bit signal into X groups of N/X bits present on X different lines; each one of the X lines carrying a signal corresponding to its N/X bits; where N and X are integers greater than one, and X is less than N.

15. A multibit digital amplifier circuit as claimed in claim 13, wherein the combiner circuit has an output which is coupled to a bandpass filter for producing an analog RF signal for application to a transmitting antenna.

16. A multibit digital amplifier circuit as claimed in claim 13, wherein said N bit digital RF signal is generated and processed by superconducting circuits.

17. A multibit digital amplifier circuit as claimed in claim 13, wherein said means for applying an operating voltage across the power terminals of each switching amplifier corresponding to the order of the group of bits applied to the signal input of the amplifier includes a voltage reference generator adapted to generate the different operating voltages for the different amplifiers.

18. A multibit digital amplifier circuit as claimed in claim 17, wherein said voltage reference generator is a Josephson voltage standard.

* * * * *